United States Patent
Gabower

(10) Patent No.: US 6,570,085 B1
(45) Date of Patent: May 27, 2003

(54) ELECTROMAGNETIC INTERFERENCE SHIELD FOR ELECTRONIC DEVICES

(75) Inventor: John F. Gabower, Mauston, WI (US)

(73) Assignee: Shielding For Electronics, Inc., Sunnyvale, CA (US)

( * ) Notice: Subject to any disclaimer, the term of this patent is extended or adjusted under 35 U.S.C. 154(b) by 989 days.

(21) Appl. No.: 08/958,595

(22) Filed: Oct. 29, 1997

Related U.S. Application Data

(60) Division of application No. 08/463,297, filed on Jun. 5, 1995, now Pat. No. 5,811,050, which is a continuation-in-part of application No. 08/254,250, filed on Jun. 6, 1994, now abandoned.

(51) Int. Cl.⁷ ................................................ H05K 9/00
(52) U.S. Cl. .............................. 174/35 MS; 174/35 R; 361/816
(58) Field of Search ................................ 206/709, 719; 427/237, 239; 174/35 R, 35 MS; 361/800, 816, 818

(56) References Cited

U.S. PATENT DOCUMENTS

| | | | |
|---|---|---|---|
| 4,106,839 A | 8/1978 | Cooper | 339/143 R |
| 4,489,116 A | 12/1984 | Flood | 428/138 |
| 4,542,076 A | 9/1985 | Bednarz et al. | 428/624 |
| 4,714,905 A | 12/1987 | Bernstein et al. | 333/167 |
| 4,933,060 A | 6/1990 | Prohaska et al. | 204/192.36 |
| 4,973,514 A | 11/1990 | Gamble et al. | 428/297 |
| 4,983,452 A | 1/1991 | Daimon et al. | 428/287 |
| 4,988,550 A | 1/1991 | Keyser et al. | 428/40 |
| 5,008,487 A * | 4/1991 | Shimmyo | 174/35 R |
| 5,017,419 A | 5/1991 | Smith | 428/209 |
| 5,028,490 A | 7/1991 | Koskenmaki et al. | 478/594 |
| 5,047,260 A | 9/1991 | Durand | 427/541 |
| 5,071,519 A | 12/1991 | Ferrill et al. | 705/164 |
| 5,084,132 A | 1/1992 | Smith | 156/659.1 |
| 5,170,009 A | 12/1992 | Kadokura | 174/35 R |
| 5,180,639 A | 1/1993 | Zarnoch | 428/412 |
| 5,191,544 A | 3/1993 | Benck et al. | 361/688 |
| 5,206,796 A | 4/1993 | Thompson et al. | 361/424 |
| 5,214,242 A * | 5/1993 | Gallagher | 174/35 R |
| 5,225,629 A | 7/1993 | Garrett | 174/365 R |
| 5,226,210 A * | 7/1993 | Koskenmaki et al. | 29/527.5 |
| 5,235,492 A | 8/1993 | Humbert et al. | 361/818 |
| 5,250,342 A | 10/1993 | Lang et al. | 428/138 |
| 5,270,488 A | 12/1993 | Ono et al. | 174/35 R |
| 5,405,000 A * | 4/1995 | Hagedon et al. | 206/216 |
| 5,436,803 A * | 7/1995 | Annis et al. | 174/35 MS |
| 5,559,677 A * | 9/1996 | Errichiello | 361/816 |

OTHER PUBLICATIONS

"Silver–Coated VALOX FR–1 Film Provides Shielding For Circuit Breakers." GE Films in Action, Jun. 1994, General Electric Co.*

"Orion Designs Economical EMI Shielding Box Without Cutting Corners" Product brochure, Orion Industries Incorporated.*

"Ultrasonic Welders Advance Clamshell Sealing Process", Packaging, Oct. 1994.*

Walter Hasler, "Electroplating and Vacuum Metalizing", Technical Report, Balzers Aktiengesellschaft, Lichtenstein, published in *Galvanotechnic*, 2 (1984).

Dieter Gwinner, "Vacuum Evaporated Aluminum for Selective Shielding of Plastic Housings", *ITEM 1993 The International Jrnl of EMC*, 1993.

(List continued on next page.)

*Primary Examiner*—Hung V. Ngo
(74) *Attorney, Agent, or Firm*—Allan L. Harms

(57) ABSTRACT

An EMI shield for personal computers, cellular telephones, and other electronic devices is constructed from thermoformable polymeric material which is then metallized on all surfaces by vacuum metallization techniques to provide an inexpensive, lightweight, yet effective EMI shield.

20 Claims, 6 Drawing Sheets

OTHER PUBLICATIONS

Kimmel & Gerke, "Chapter 7: Shielding for EMI control. . . and how to do it right", *EDN*, Jan. 20, 1994 Supplement.

"EMI Protection in Consumer Portable Products", *Electronic Packaging and Production*, Mar. 1994.

Leonard, "What's hot and what's not in EMI shielding of plastics", *Plastics Design Forum*, Mar./Apr. 1993.

Minnesota Mining & Mfg. Co., "6100 Thermoformable EMI–Shielding Material", 1994.

Concise Encyclopedia of Polymer Science & Engineering, John Wiley & Sons, 1990 ISBN 0–471–51253–2, pp. 446–447, 744–746, 1192–1195.

Degassing of Plastic Materials/Plasticizers, L. Holland, "Vacuum Deposition of Thin Films", Chapman & Hall Ltd., London 1966, pp. 46–47, 52–53.

Aluminum Evaporation (Time–Temp.) T. LaBounty, "How Do Others Metallize?", Midwest Technical Service, "Tips", 1980 p. 19.

"Machinery's Handbook", E. Grerg, F. Jones and A. Horton, Industrial Press, New York, NY 1976, pp. 2299–2301.

D. Rigney, "Vacuum Coating", pp. 387–388, 390–410. (No Date).

Leon I. Maissel & Reinhard Glang, "Handbook of Thin–Film Technology", McGraw–Hill 1970, pp. 1–7, 8; 1–26 et seq; 1–38, 39.

Placon Corp., Madison, Wisconsin Sales Brochure. (No Date).

Gabower, John H. (Jack), Thermoformed Vacuum Metallized Inserts For EMI Shielding of Electronic Devices, Consumer Electronics Show, Flamingo Hilton and Tower, Las Vegas, Nevada. (No Date).

Adams, Frank; "Taking the Mystery Out of Metallizing"; Technical Publishing Company, 1975, 1976.

Midwest Tungsten Service, Tips—Vacuum Metallizing Electrical Problems, 1986.

Mooney, "Trend to Lower Cost Resins Will Accelerate", *Plastics World*, Apr. 1995.

"Style CBS Circuit Board Component Shielding—Design Guide 4", product brochure, Leader Tech, Tampa, Florida. (No Date).

Product Announcement, BMI, Inc., "Modular Shielding System" *EE–Evaluation Engineering*, Apr. 1995.

"Methods of Controlling EMI", *EMI/RFI Shielding Guide*, General Electric Plastics Co. (No Date).

Chomerics, Inc., "EMI Shielding for Commercial Electronics", 1994.

Gabower, Jack (John H.), "Thermoformed Vacuum—Metallized Inserts for EMI Shielding", *Item 1995—The International Journal of EMC*, Robar Industries, Inc., 1995, pp. 120, 122, 127.

Vacuum Platers, Inc., "VAEMAT High Performance Vacuum Evaporated Film Coatings", Product Data Sheet. (No Date).

Vacuum Platers, Inc., Advertising Folder. (No Date).

* cited by examiner

ELECTROMAGNETIC INTERFERENCE SHIELD FOR ELECTRONIC DEVICES

This application is a division of application Ser. No. 08/463,297 which was filed Jun. 5, 1995, now U.S. Pat. No. 5,811,050 which was a continuation-in-part of Ser. No. 08/254,250 filed Jun. 6, 1994 now abandoned.

BACKGROUND OF THE INVENTION

This invention pertains to shielding apparatus for containing high frequency electromagnetic radiation within a personal computer, cellular telephone, or other electronic instrument.

Electromagnetic compatibility (EMC) is a broad term used to describe electromagnetic interference (EMI), radio frequency interference (RFI) and electrostatic discharge (ESD), and the above terms are often used interchangeably.

The fact that electronic devices are both sources and receptors of EMI creates a two-fold problem. Since electromagnetic radiation penetrating the device may cause electronic failure, manufacturers need to protect the operational integrity of their products. Secondly, manufacturers must comply with the regulations aimed at reducing electromagnetic radiation emitted into the atmosphere. Proper design is necessary to prevent the device's function from being disrupted by emissions from external sources and to minimize its system's emissions.

Today, plastics are replacing metals as the material for electronic enclosures since plastics offer increased design flexibility and productivity with decreased cost. The switch from metal to plastics as a housing material for electronic equipment has contributed to concern over EMI shielding. Plastics are insulators, so EMI waves pass freely through unshielded plastic without substantial impedance or resistance. Additionally, ever increasing device miniaturization and the increase in clock speeds of microprocessors used in computing devices makes it more difficult to handle the EMI pollution these faster computers generate. So a variety of technologies using metal/polymer combinations and composites are being used as a shielding material in electronic devices.

Current methods for shielding of electromagnetic interference (EMI) include the use of metal housings, metal, filled polymer housings, metal liners for housings, and conductive coatings for the interior of rigid polymer or composite housings.

Metal coatings for rigid plastic housings are applied through use of conductive paints or through application of metal platings applied by chemical plating (electroless plating), by electroplating, or through vacuum metallization. In addition, metal foils with adhesive backings may be applied to the inside of plastic cases for electronic instruments to achieve shielding requirements. Zinc Arc spray techniques are also available to apply a metal coating to a plastic housing.

Another shielding material is provided through the use of metal fibers sintered onto a polymeric substrate as is taught in U.S. Pat. No. 5,226,210, and commercially produced as #M 610D Thermoformable EMI-shielding material by the Minnesota Mining and Manufacturing Company of St. Paul, Minn.

Each of the current shielding methods have shortcomings. The major disadvantages of plating are its high cost, complex process cycles, and its application is limited to only certain polymer resins. Metal-filled resins for injection molding suffer from poor conductivity compared to metals. The conductive polymer resin is very expensive and complex shape molding is difficult from flow and uniformity perspectives.

Three general types of conductive metal-bearing paints are in general use. Silver paints have the bast electrical properties but, they are extremely expensive. Nickel paints are used for relatively low attenuation applications and are limited by high resistance and poor stability. Passivated copper paints have moderate cost and lower resistivity, but also lack stability. All paint applications have difficulties with coating uniformly, blow back in tight areas and recesses depending on part complexity, and application problems which can lead to flaking. Paints also fail ESD testing over 10 KVA.

EMI shielding through the use of metal cases for the personal computer or other electronic device may not always be desired because of concerns about weight and aesthetics, with weight being a serious concern for laptop computers or portable and handheld devices of any types. The use of a metal shroud to line a plastic case improves over the metal case in aesthetic and design concerns for the outside of the housing but results in an increased assembly step and little weight minimization. Metal also lacks the ability to be formed into complex shapes often taking up unnecessary room adjacent to the circuitry and assembled electrical components.

The use of coated plastic housings for electronic devices, including microcomputer and cellular telephones, may not provide a suitable solution when one considers that personal computers currently offered may operate at clock speeds of 100 MHz which gives rise to opportunities for EMI generation not previously confronted in the personal computer industry. Further, the ever increasing clock speeds of the personal computers being offered makes effective shielding more and more challenging since any breach in the shield which has one dimension in excess of 0.23 inch may allow substantial EMI leakage, causing the unit to fail United States Federal Communication Commission standards.

The use of metallic coatings on plastic housings presents certain manufacturing and service concerns. A slipped tool used during assembly or a repair can cause a scratch in the metal coating of sufficient size to cause a slot antenna, thereby making the case totally useless, and thereby leading to a costly item being discarded with little feasibility for successful recycling.

The seams of a metal plated plastic housing will act like slot antennae unless the housing sections are conductively joined by the use of overlapping joints, conductive gaskets, or conductive tape. When the housing must be opened for a repair or retrofit, it can be understood that some of the conductive interconnection may be degraded by the activity of disassembly.

Further background on prior art methods and characteristics of shielding methods may be examined in 'EMI/RFI Shielding Guide" published by the GE Plastics Division of the General Electric Company, and in "the Designer's Guide to Electromagnetic Compatibility" by Gerke & Kimmel, Supplement to EDN Magazine, Volume 39, No. 2, (Jan. 20, 1994) to both of which the reader is directed.

SUMMARY OF THE INVENTION

This invention pertains to EMI shielding for personal computers, cellular telephones and other electronic devices which are subject to Part 15 of the FCC Rules. A thermoformable polymeric sheet is formed into an enclosure sized and shaped to enclose an EMI emitting subsystem or component. The thermoformed polymeric enclosure is then metallized on all or selected surfaces by vacuum metallizing techniques where the thermoformed enclosure is placed in a vacuum chamber, treated with an ionized gas, and then metallized by the use of aluminum or other metal being vaporized by use, for example, of a current-passing tungsten filament, or other vaporization techniques. The enclosure is rotated within the chamber to allow metallization of all desired surfaces. Masking may be employed when certain regions or surfaces are preferred not to be metallized. The enclosure is thereby provided with walls having a polymeric substrate provided on desired surfaces with a vacuum metallized layer. The vacuum metallized layers are of sufficient thickness to make the surfaces of the enclosure electrically conductive. The enclosure is formed in the shape and size necessary to house and shield the EMI emitter; for example in the case of a personal computer, the enclosure may serve as a thin-walled case within the rigid outer housing of the computer. Alternatively, the enclosure may be formed to fit as an insert within a device's housing as a substitute for a metal insert shield, or the enclosure may be shaped and sized to contain only certain components which are emitters of, or susceptible to, EMI. Gangs of metallized enclosures may be devised with electrical isolation as desired provided by gaps in the metallization layers. Different electronic devices will require varying degrees of attenuation or shielding effectiveness. The enclosure may be coated on all surfaces or selectively coated for certain applications.

Thermoformed shapes have previously been vacuum metallized with thin-film coatings (350 to 1000 angstroms or 0.035 to 0.10 microns) but only for their reflective metallic appearance. Conventional thin-film vacuum metallizing is not adequate to dissipate EMI. Existing equipment for metallizing thermoformed shapes for ornamental reflective appearance purposes is not suitable for application of relatively thick thin film as is required to provide suitable surface impedance to allow effective EMI dissipation.

Many polymeric materials are thermoformable. Formability, thickness, melt strength, shrinkage, flame retardency, and other properties are factors determined by the end user of the finished product. Extruded roll or sheet materials suitable for thermo forming include Acrylonitrile-Butenate-Styrene (ABS), polystyrenes, cellulose polymers, vinyl chloride polymers, polyamides, polycarbonates, polysulfones, and olefin polymers such as polyethylene, polypropylene, polyethylene terephthalate glycol (PTG) and methyl methacrylate-acrylonitrile (co-polymers).

Use of these polymers with additional fillers such as carbon black, graphite, and metal fibers, add to the shielding effectiveness for absorbing more of the lower electromagnetic wave lengths.

The polymeric enclosures are not metallically; coated until after the thermoforming process. Because the forming process stretches or draws the material into corners and recesses, it would also draw or thin the metallic coating making its uniformity vary in different areas on the formed shape if coatings were applied prior to forming.

After forming, metallic coatings may be applied to the shapes by a variety of vacuum deposition techniques such as thermal evaporation, cathode sputtering, ion plating, electron beam, cathodic-arc, or vacuum thermal spray.

Because a thermoformed enclosure is used, the shield is of reduced weight and if damage occurs to the thermoformed shield during manufacturing or repair of the electronic device, a less costly replacement item is needed.

The use of interlockable enclosure bodies which may snap together or otherwise be mechanically held in assembled state, permits the walls of the shield to be in conductive contact and reduces or eliminates the need for conductive tape or conductive gaskets while providing an effective EMI shield. Further securing means may be employed, such as by use of conductive adhesive, laser welding, or heat sealing.

It is accordingly an object of the invention to provide an EMI shield which may be thermoformed into a desired shape with metallization applied on all surfaces of the shield.

It is another object of the invention to provide an EMI shield which provides an easy-to-manufacture shield with excellent attenuation of the strength of electric or magnetic fields.

Another object of the invention is to provide an inexpensive EMI shield that will not be totally degraded by a scratch on one surface of the shield.

Another object of the invention is to provide an EMI shield which is light weight.

Another object of the invention is to provide an EMI shield which may be nested for shipment.

Another object of the invention is to provide an EMI shield with superior conductive wall coupling structure.

Another object of the invention is to provide an EMI shield which will not need application of conductive tape or gaskets to provide adequate shielding.

Another object of the invention is to provide an EMI shield which increases resistance of the shielded components to corrosive atmospheric conditions.

These and other objects of the invention will become understood from a review of the detailed description of the invention which follows.

DESCRIPTION OF THE DRAWING FIGURES

DETAILED DESCRIPTION OF THE INVENTION

Figure 1:
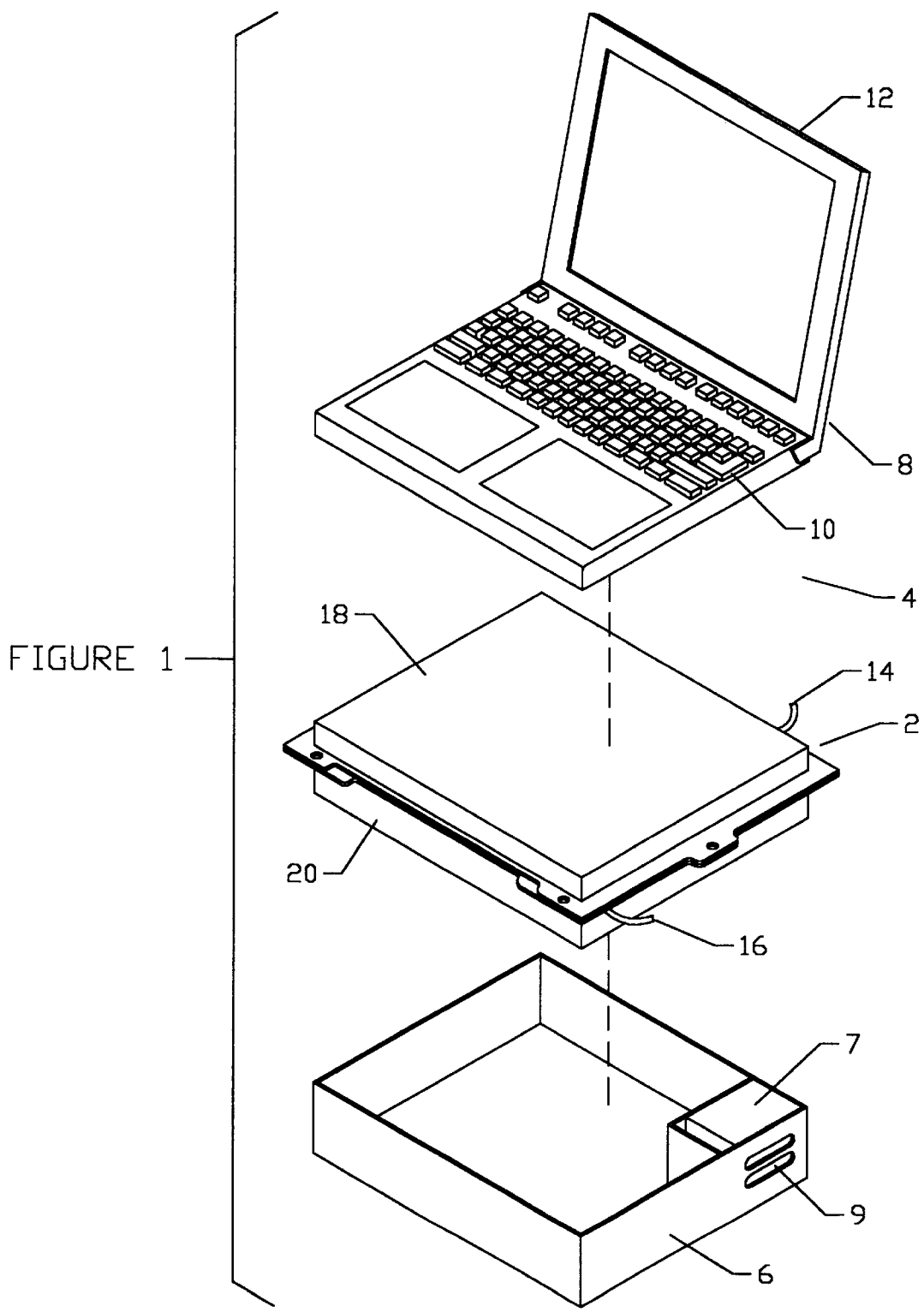
FIG. 1 is an exploded perspective view of a laptop personal computer having the shield invention installed therein.

Referring to the drawing figures and in particular to FIG. 1, the invention 2 is shown in place as a component of a laptop personal computer 4. Bottom case 6 of computer 4 is provided with power supply module 7 stationed therein.

Invention 2 encloses the mother board of the computer 2, including the central processing unit, memory storage chips, input-output circuit components and the like (not shown). Top case 8 overlies invention 2 when invention 2 is placed within bottom case 6 of computer 4. Top case 8 includes keyboard 10 and visual display 12 which are interconnected to associated circuitry housed in invention 2 by leads 14. Power supply 7 and input/output ports 9 are electrically connected to associated circuitry housed in invention 2 by cables 16.

Figure 2:
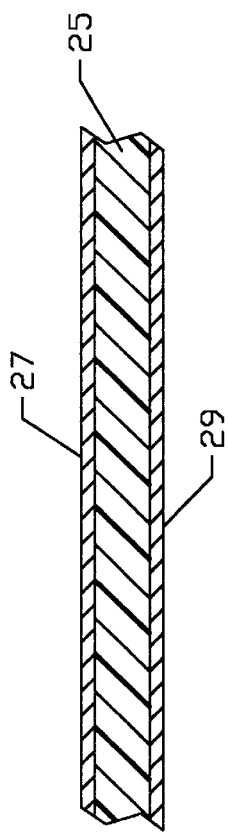
FIG. 2 is an enlarged view of a typical cross section of a sidewall of the preferred embodiment shield invention.

FIG. 2 discloses a cross section of a wall of invention 2, showing a polymeric substrate 25 having conductive metallization layers 27 and 29 applied thereto by vacuum metal deposition techniques. Each of layers 27 and 29 are a relatively thick, thin film of metal, preferably of aluminum, copper, or silver. In the preferred embodiment, aluminum is used, and is applied to the polymeric substrate 25 after the polymeric substrate has been thermoformed into a desired enclosure shape and then its surface is modified by bombardment by an ionized gas in an evacuated chamber or by other means suitable to increase surface tension of the substrate 25. The substrate 25 is then placed in an evacuated chamber where a metal is vaporized and deposited on the substrate 25 on the surfaces thereof, through rotation of the substrate 25 about itself and about the metal vapor source. Substrate 25 has been earlier formed into a desired shield shape before application of the metallization layers 27 and 29 in order to achieve a uniform thickness of metallization over the surfaces of substrate 25. By thermoforming substrate 25 before subjecting it to the metallization step, problems with thinning of the metallization layers 27 and 29 at corners, bends and the like, which might occur if the substrate were formed after metallization is applied, are avoided. If desired, certain regions of substrate 25 may be masked to prevent deposit of metal film on those regions.

By applying a relative thick film (between 1.0 and 50 microns thick), which has a surface impedance of less than one ohm per square per inch, a suitably conductive layer of metallization is achieved which provides a low surface impedance and hence effective EMI attenuation. The application of metallization layers 27 and 29 to opposing sides of substrate 25 increases the EMI attenuation achieved.

Figure 4:
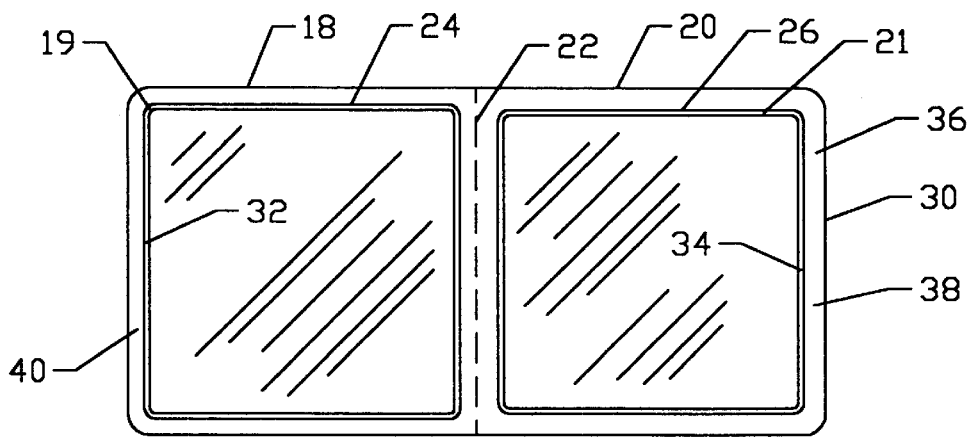
FIG. 4 is a plan view of the preferred embodiment of the invention in its unfolded arrangement.

FIG. 4 discloses the preferred embodiment of the invention 2 in its unfolded state. Polymeric sheet material is thermoformed into a desired shield blank 30 by conventional methods. Blank 30 comprises first section 18 and second section 20 interconnected by hinge region 22, all of which are formed from continuous polymeric sheet of generally uniform thickness. By use of thermoformable material, it can be understood that light weight is realized and that unassembled shield blanks 30 may be nested for shipment.

Figure 5:
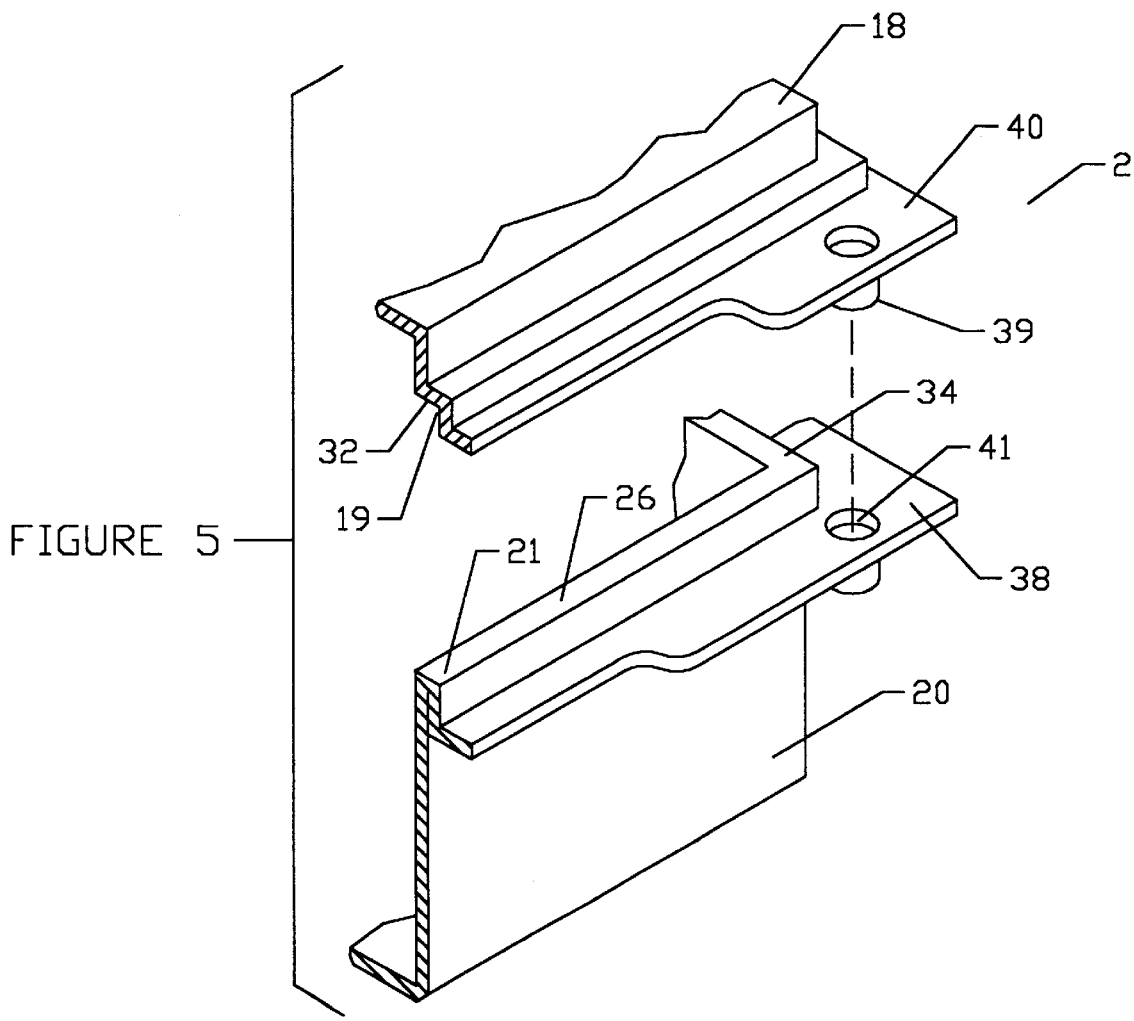
FIG. 5 is an enlarged perspective view of the interconnecting edges of the preferred embodiment shield invention.

From FIGS. 4 and 5, it can be seen that the edges 24 of first section 18 of blank 30 are formed to fit in complementary engagement with the edges 26 of second section 20 of blank 30. In particular, edges 24 of first section 18 are provided with shoulder recesses 19 wherein ridges 21 of second section 20 are receivable, such that the periphery 34 of second section 20 is overlapped by the periphery 32 of first section 18 when first section 18 and second section 20 are folded about hinge region 22 into engagement. By this overlap, EMI shielding is made substantially thorough as the touching engagement of overlapping second section 20 on first section 18 provides electrical conductivity between the sections. Conductive adhesive or conductive tape may be added to the seam formed between first section 18 and second section 20 to ensure sufficient EMI shielding in the seam region. Hinge region 22 provides a conductive path between first section 18 and second section 20. To aid in reducing gaps in EMI shielding effect, conductive adhesive 36 may be applied to flanges 38 and 40 of blank 30, which will come into abutment when enclosure bodies 18 and 20 are folded about hinge 22 for edgewise engagement.

FIG. 5 illustrates further the novel mechanical locking means of the preferred embodiment EMI shield 2. Boss 39 is formed upon flange 40 of first section 18 and is engageable with recess 41 formed in flange 38 to provide additional retention forces when first section 18 and second section 20 are engaged.

Figure 3:
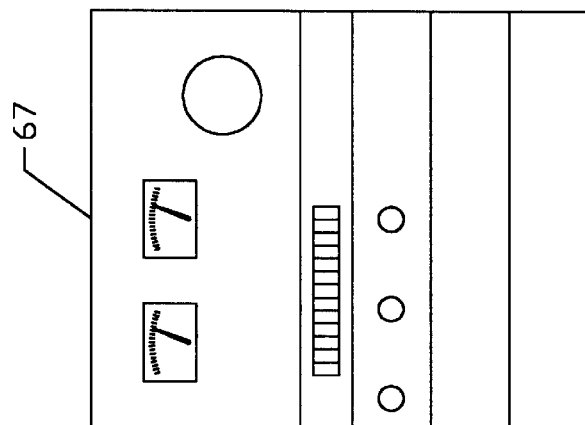
FIG. 3 is a schematic view of the typical apparatus used for applying metal deposition to the polymer thermoforms of the preferred embodiment.
Figure 3:
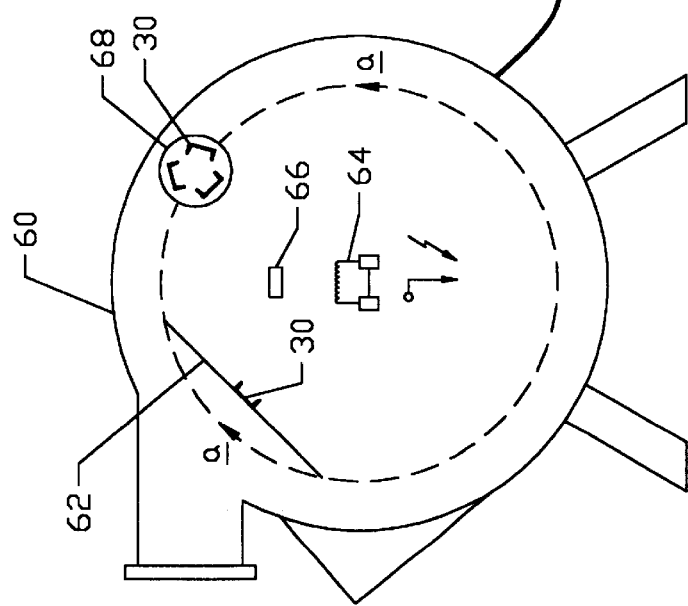

FIG. 3 discloses apparatus for vacuum deposition of metallic coating on thermoformed blank 30 which is placed on carrier 62 in evacuable chamber 60. Chamber 60 is evacuated and a gas, including a gas from the group including Argon, Nitrogen, Oxygen, $CF_6$ and $SF_4$, is passed into chamber 60, excited by an electric charge, and the resulting ionized gas serves to modify the surfaces of blank 30. Chamber 60 is again evacuated and carrier 62 is caused to revolve around tungsten filament 64 which is energized electrically to provide energy to vaporize metal 66, the molecules of which travel from filament 64 and are deposited on blank 30. Blanks 30 may alternatively be retained to planetary mount 68 which rotates about itself as it revolves about filament 64 in the direction of arrows a. Control 67 is associated with chamber 60 to cause evacuation of the chamber, introduction of gas for surface modification of the blank, and energization of the filament.

Figure 6:
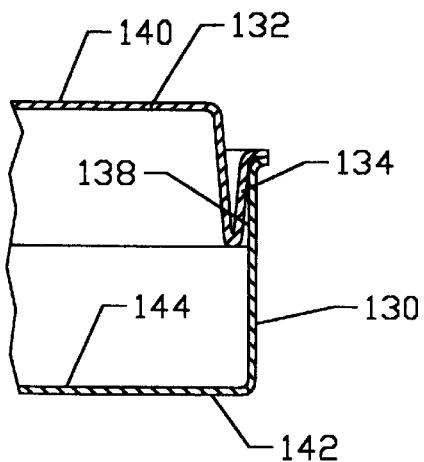
FIG. 6 is an enlarged cross section of the engagement between a cover member and a base member of an alternate embodiment of the shield invention.

FIG. 6 illustrates another embodiment of the shield invention wherein a thermoformed case 130 is formed of formable sheet polymer. Lid 132 is likewise thermoformed of sheet polymer into a complementary shape. Lid 132 is provided with spring element 134 about its periphery, spring element 134 being formed upon lid 132 and being urged into touching engagement with inner surface 138 of case 130. After case 130 and lid 132 are suitably thermoformed, they are passed through a vapor metal deposition operation where a metal film is deposited on selected surfaces, including all surfaces thereof if desired. In the embodiment of FIG. 6, metal film of thickness between 1.0 and 50.0 microns is deposited upon outer surface 140 of lid 132 and a similar metal layer is vapor deposited upon outer surface 142 of case 130 and upon inner surface 138 of case 130. Inner floor surface 144 of case 130 is polymeric, having been masked to prevent deposit of metallization thereon. In this embodiment, conductivity of surface 144 has been avoided in order to prevent interference with surface circuitry of a component carrying board which may be installed within the shield of FIG. 6.

Figure 7:
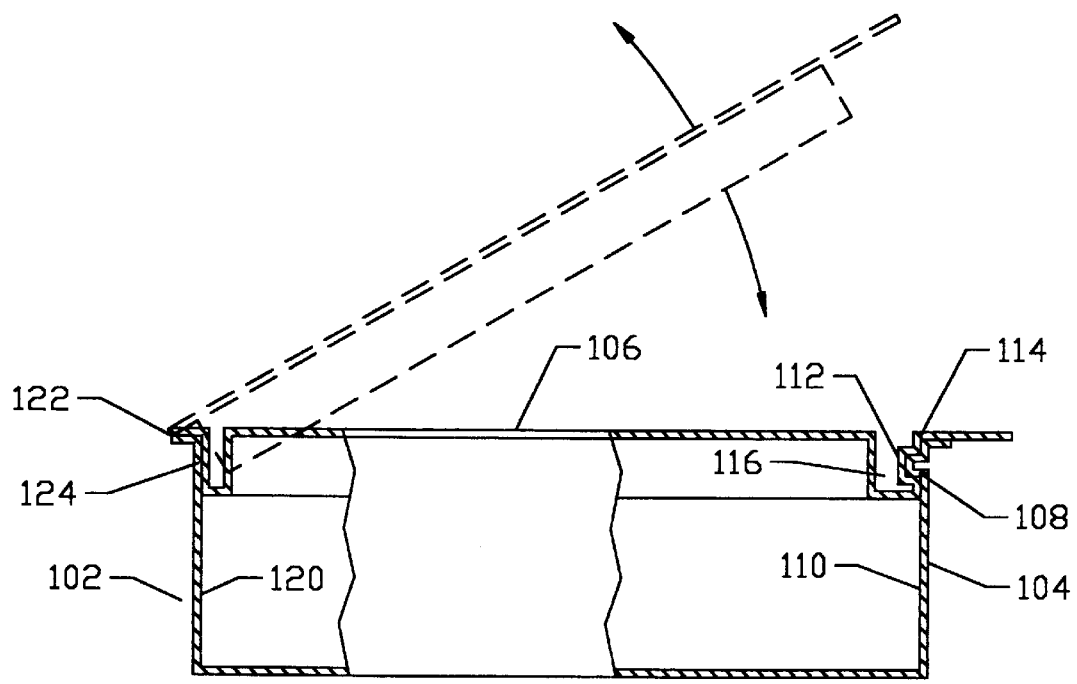
FIG. 7 is an enlarged cross section of a second alternate embodiment of the shield invention showing the cover thereof in phantom in an open position.

FIG. 7 discloses another alternative embodiment of the shield invention wherein shield body 102 comprises a thermoformed polymer base 104 with a hinged cover member 106. Shield body 102 is provided with projections 108 upon the upper area of first sidewall 110. Cover 106 is fixed by hinge 122 to case 104 and is provided with indents 112 which are formed in the outer leg 114 of U-shaped recess 116. Recess 116 extends around the periphery of cover 106 and is provided to permit touching engagement of outer leg 114 with the sidewalls of base 104. At region 124, for example, conductive surface contact is provided between base 104 and cover 106.

Shield 102 is first thermoformed into the desired shape from sheet polymer material and then a metallic layer is vapor deposited on all or selected surfaces of shield 102. The metallic layer is suitably thick to provide excellent surface conductivity thereby providing excellent EMI attenuation.

It can be further understood that thermoformed shapes such as enclosure bodies 18 and 20, of FIG. 4 may be ganged together by interconnected webs, such as hinge 22 of FIG. 4, wherein a metal deposition layer is applied to the outer surfaces of shapes 18 and 20 respectively while no metallization is applied to hinge 22, such result being effected by application of masking to hinge 22 before it is passed into the evacuated chamber where metal is to be vapor deposited thereon. The resulting gang of metallized shapes may then be used to provide EMI shielding to discrete though adjacent components or component groups on a circuit board where the components or groups are separated by a distance substantially equivalent to the dimension of the web (hinge 22) between sections 18 and 20. The absence of conductive metal coating on hinge 22 prevents conduction of electrical signals from one shape to the other while providing an efficient system of creating inexpensive EMI shield gangs.

Vacuum deposition is the vaporization and subsequent condensation of any metal or compound onto a substrate in a substantial vacuum. Although commonly referred to as a single process, the deposition of thin films by vacuum evaporation consists of several distinguishable steps, namely: transition of a condensed phase, which may be solid or liquid, into gaseous state; metal vapor traversing the space between the evaporation source and the substrate at reduced gas pressure; condensation of the vapor upon arrival on the substrates. Accordingly, the theory of vacuum evaporation includes the thermodynamics of phase transitions from which the equilibrium vapor pressure of materials can be derived, as well as the kinetic theory of gases which provides models of the atomistic processes. Further investigation of the sometimes complex events occurring in the exchange of single molecules between a condensed phase and its vapor led to the theory of evaporation, a specialized extension of the kinetic theory. The distribution of deposits on surfaces surrounding a vapor source can be derived. The kinetic aspects of condensation processes are a topic in their own right relating to nucleation and growth phenomena. Vacuum deposition and its applications have benefited from various disciplines which have contributed toward solutions of practical problems. These pertain to the design of suitable vapor sources and the development of special techniques for the evaporation of metals, alloys, compounds, and a variety of vacuum systems with specialized process controls and automation.

The transition of solids or liquids into gaseous state may be treated as a macroscopic or as an atomistic phenomenon. The former approach is based on thermodynamics and yields a quantitative understanding of evaporation rates, interactions between evaporants and their containers, stability of compounds, and compositional changes encountered during the evaporation. The atomistic approach is derived from the kinetic theory of gases and provides models which describe evaporation processes in terms of properties of individual particles. The latter theory also applies to the evacuation of vessels. Thermodynamic and kinetic theories are treated in various textbooks and often times research data will vary from text to text.

Coating properties depend on deposition procedures which become quite complex and must be monitored closely from cycle to cycle to maintain consistency. Every detail is important and details of procedures are usually proprietary. Relevant coating properties related to deposition of any metal consist of (1) coating structure, (2) internal stress and (3) adhesion. As any metallic coating grows from ultra-thin (10 angstroms, 0.001 microns) to relatively thick, thin-films (up to 500,000 angstroms, 50 microns), various coating zones result from the interaction of the basic processes that occur during deposition, coating flux transport, and surface and bulk diffusion. When a coating is applied to a substrate, stresses usually develop within the coating and at the interface, consisting primarily of superimposed thermal and intrinsic stresses. The mechanisms of adhesion between metal coatings and organic polymers (thermoformed substrates) are typical of those that are generally observed, classed as mechanical or interlocking, weak boundary layer, chemical, and electrostatic. Film discoloration, substrate warpage, even total part destruction, can easily occur if the product or vaporization time and current is too high, the load is not large enough, or part placement is not optimal. Firing too long or at an excessively high current can burn or thermal warp the substrates.

When vacuum deposition is used to coat thin wall thermoformed shapes, care must be taken in the deposition process.

During the metal deposition cycle heat is generated and the distance from the deposition source to the thin-walled thermoformed pieces becomes a critical factor. In an evacuated chamber, there is little conduction or convection of heat but the radiant energy from the evaporant source can distort, warp, and even melt the polymer forms, especially in corner, or deep draws where the film is drawn to its thinnest dimension. Thermal properties and wall thickness of the thermoformed film, heat output of the evaporant source, distance from source to substrate, duration of vaporization, and rotation speed of the substrate are all variables which need consideration.

The critical factors which need to be considered when vacuum metallizing thermoforms are:

1) Thermal properties and thickness of the wall of the substrate.
2) Method and heat dissipation of evaporation.
3) Duration or time cycle of deposition.
4) Pressure within the chamber.
5) Type and amount of material being vaporized.
6) Speed or movement past the vaporization source.
7) Substrate distance from the evaporant source.

Transfer of heat within a solid, liquid, or gaseous media from one medium to another can occur by conduction, convection, or radiation. When coating within a vacuum, conduction and convection become insignificant and radiant heat transfer is the significant attribute to control. Thermoformed shapes not corresponding to any definite or simple geometry generally do not constitute cases of unidimensional heat transfer. The method of vaporization and time also affects the amount of energy released from the vaporization source.

The following table shows a comparison of the typical energies for the different types of vacuum deposition sources.

| Type of Deposition | Electrical Vapor State | Thermal Energy |
| --- | --- | --- |
| Thermal Evaporation | Electrically Neutral | 0.1 to 0.3 eV |
| Ion Beam | High Negative Potential (3000 to 4000 V) | 10 to 40 eV |
| Sputtering | High Negative (Variable) | 10 to 40 eV |

The radiant heat output from both ion beam and sputtering along with the extended cycle times needed to deposit relatively thick thin films make these methods less commercially feasible than the thermal evaporation method. Thermoformed polymers have much lower thermal. conductivities and thermal diffusities than injection molded parts and are more susceptible to damage from the radiant heat and cycle times necessary for the other two methods of evaporation, namely sputtering and ion beam.

For practicable deposition rates, source materials should be heated to a temperature so that its vapor pressure is at least 1 Pa ($10^{-2}$ torr) or higher. Table A represents these temperatures for several common elements.

TABLE A

TABLE TEMPERATURE FOR VAPOR PRESSURE OF 1 Pa ($10^{-2}$ torr)

| Element | Temperature C. | Temperature F. |
|---|---|---|
| Aluminum | 1150 | 2100 |
| Beryllium | 1245 | 2270 |
| Cadmium | 265 | 510 |
| Carbon | 2460 | 4460 |
| Chromium | 1400 | 2550 |
| Copper | 1260 | 2290 |
| Gold | 1400 | 2550 |
| Indium | 945 | 1730 |
| Lead | 715 | 1320 |
| Magnesium | 440 | 825 |
| Manganese | 940 | 1720 |
| Molybdenum | 2350 | 4260 |
| Nickel | 1530 | 2780 |
| Platinum | 2090 | 3790 |
| Silicon | 1470 | 2680 |
| Silver | 1630 | 2970 |
| Tantalum | 3060 | 5540 |
| Tin | 1250 | 2280 |
| Titanium | 1740 | 3160 |
| Tungsten | 3230 | 5840 |
| Zinc | 345 | 650 |
| Zirconium | 2400 | 4350 |

Aluminum is the most common element used for vacuum deposition and because of its various properties, aluminum is used in as many as ninety percent of the deposition applications. Although at a pressure of 1 Pa its vapor temperature is 2100° F., it is normally vaporized at a temperature over 3000° F. (1649° C.). Actual results have proven aluminum vaporized most efficiently at vapor temperatures between 3300° F. to 3600° F. This is approximately 50 percent above the actual vapor temperatures (at 1 Pa). Other elements react relatively similarly although they may have their own idiosyncratic characteristics. When vapor temperatures are very high and vapor source temperatures are very high, as hot gaseous vapor flux travels from the source towards the substrate, its temperature rapidly dissipates with the distance traveled. Surface measurements made on thermoforms twelve inches from the source indicate that the vapor flux temperature is reduced to approximately 185° F. to 190° F. (85° to 90° C.) as it condenses on the part surfaces. It is interesting to note that vapor source temperatures are normally ten to twenty-five times greater than the heat deflection temperature of the substrate polymers being processed.

Figure 8:
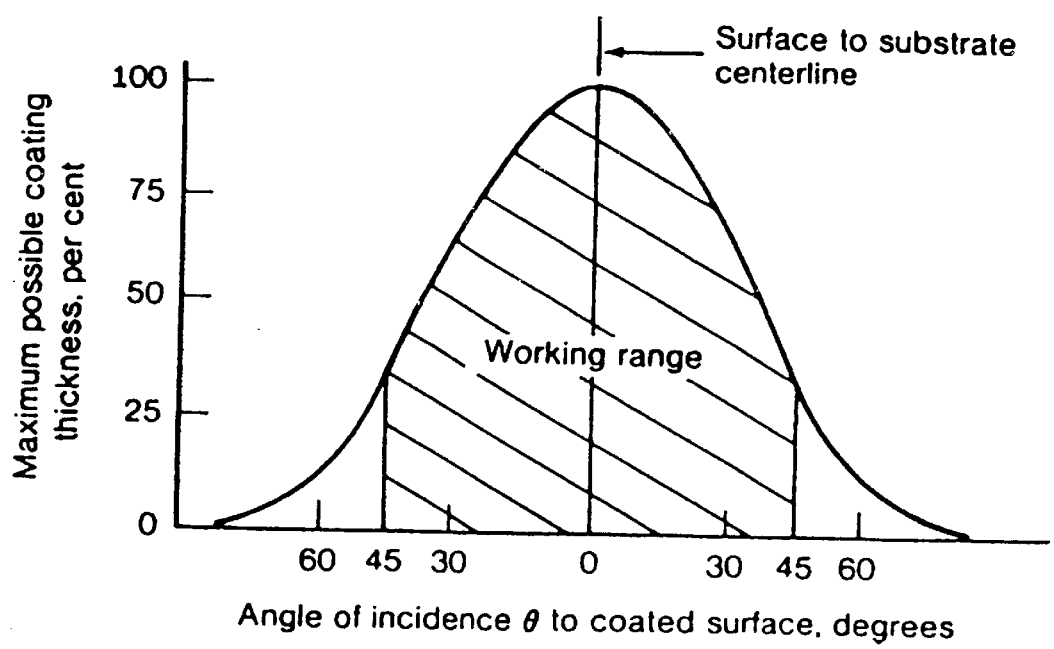
FIG. 8 is a graph of relative coating thickness as a function of vapor steam incident angle.

The relative ease of vacuum coating any part is related to its shape or configuration, its position relative to the vapor source (vapor flux) and its distance from the source. FIG. 8 shows that maximum coating thickness is obtained at a centerline to the substrate. As the angle of incidence increases, the thickness decreases rapidly dropping to less than fifty percent at a forty-five degree angle. At more than a forty-five degree angle, the coating density and adhesion are also very poor.

Distance from the vapor source to the part to be coated is the most important process variable and the easiest to control. Although the vapor source may be movable in some equipment designs, it is usually fixed. Substrate tooling and fixturing set-ups are normally conveniently arranged to be adjustable to accommodate distance changes for differing substrates. It is well known in the art that when decorative coatings (less than 0.1 microns thick) are applied to injection molded parts (parts with wall thickness greater than 0.040 inches) a distance from eight inches to twelve inches between vapor source and part should be maintained to prevent warpage and burning. The thicker the part and higher the thermal properties, the closer the part may be placed to the vapor source.

Our experiments with thin-walled thermoforms (0.006 to 0.020 inches thick) and EMI functional coatings (over 1.0 microns thick) have developed the results listed in the following table B. A minimum distance of twelve inches should be maintained for even the highest thermal property films.

TABLE B

DISTANCE FROM VAPOR SOURCE TO SUBSTRATE
IN INCHES FOR VARIOUS THERMOFORMED RESINS[1]

| RESIN SYMBOL | NAME | HEAT DEFLECTION TEMP. ° F. (UNFILLED RESIN)[2] | MINIMUM WALL THICKNESS | DISTANCE FROM VAPOR SOURCE |
|---|---|---|---|---|
| PI | Polyimide | 460–480 | .006 in. | 12 to 14 inches |
| LCP | Liquid Crystal Polymer | 428–465 | .006 in. | 12 to 14 inches |
| PEI | Polyetherimide | 387–392 | .010 in. | 12 to 14 inches |
| PS | Polysulfone | 345 | .010 in. | 12 to 14 inches |
| PC | Polycarbonate | 250–270 | .010 in. | 14 to 16 inches |
| PBT | Polybutylene Terphthalate | 248–266 | .010 in. | 14 to 16 inches |
| PPS | Polyphenylene Sulfide | 221 | .012 in. | 16 to 18 inches |
| ABS | Acrylonitrile-Butadiene-Styrene | 170–220 | .012 in. | 16 to 18 inches |
| HIPS | High-Impact Polystyrene | 170–205 | .012 in. | 16 to 18 inches |
| PETG | Glycol-Modified Polyester | 145–151 | .015 in. | 18 to 20 inches |
| PVC | Polyvinyl Chloride | 130–150 | .015 in. | 18 to 20 inches |
| PP | Polypropylene | 120–140 | .015 in. | 18 to 20 inches |

[1]Samples processed in 66 inch diameter vacuum metallizer with 30 kVA power source at fifty percent power, 20 tungsten wire vapor sources with 1200 mg. of aluminum per filament, 30 second evaporant time, over 3000° F. flash temperature at a chamber pressure of 1 Pa ($10^{-2}$ torr).
[2]ASTM D 648, Heat deflection temperature under flexural load, 264 P.S.I.

Polyimide (PI) and liquid crystal polymer (LCP) represent the most heat resistant thermoforms coated. A six millimeter wall thickness thermoformed shape of PI placed at a distance of twelve inches from the vaporization source was found to be the limiting combination of wall thickness and distance to evaporant source which could be achieved without heat distortion. It should also be noted that specialized or custom thermoforming equipment is necessary to form shapes from these materials because they require higher forming temperatures with longer heating and cooling cycles.

Figure 9:
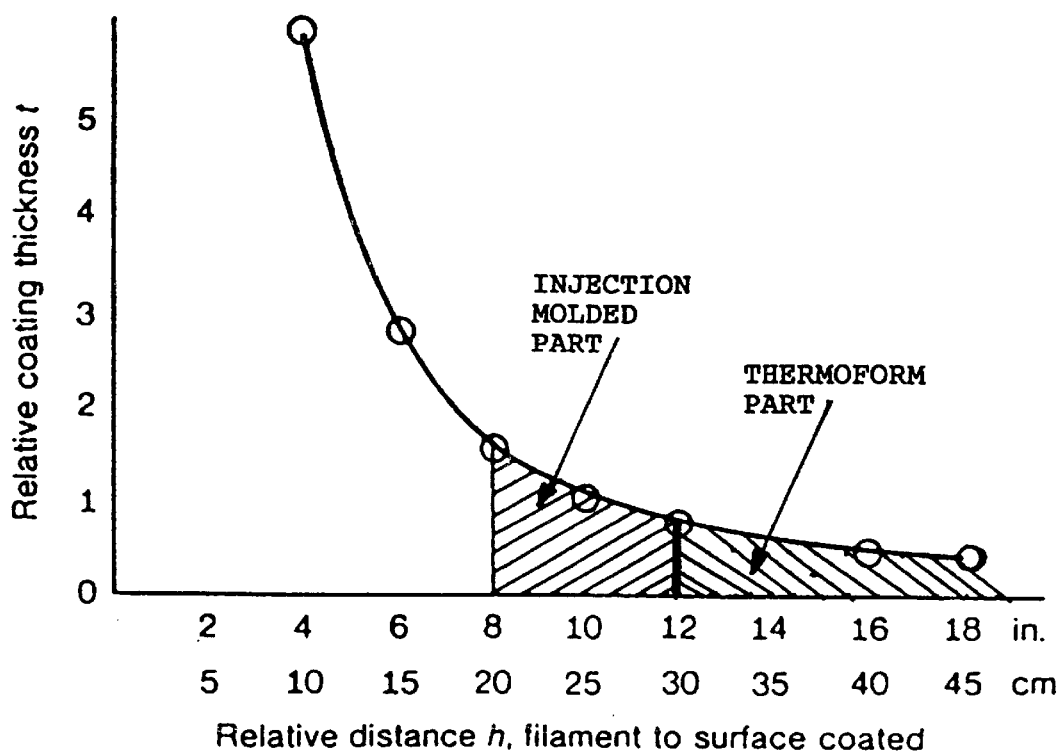
FIG. 9 is a compoarison of work range injection molded vs. Thermoformed parts distance from part to vapor source.

The more commonly used thermoformed materials such as high-impact polystyrene, polypropylene, ABS, polyvinyl chloride, and PETG have much lower-thermal properties. A minimum wall thickness of 0.012 to 0.015 inches is required and working distances of from 14 inches to 18 inches should be maintained. In the cases of polypropylene and PVC at wall-thicknesses of 0.015 inch, it is also advisable to reduce the power setting to the evaporant source by twenty-five percent and increase the time cycle by twenty-five percent to prevent warpage (primarily due to "hot spots" in the vapor flux). FIG. 9 shows relative coating thickness as a function of vapor source-to-part distance comparing injection molded parts to various thermoforms.

It should be understood that thin-walled thermoforms from polymeric sheet of thicknesses from 0.006 inches to 0.100 inches are contemplated by this invention to be metal coated and used for EMI shielding, as are thick-walled thermoforms having wall thickness in excess of 0.100 inches.

RECYCLING

Two options for recycling metallized inserts are available. The first is chemical stripping and the second is simply regrinding and re-extruding the scrap for reuse.

Vacuum deposited aluminum is easily removed with solutions of potassium and sodium hydroxide. These spent solutions containing aluminum can be diluted or neutralized with acid. Solutions with a pH under twelve which contain no heavy metals can be released to a sanitary sewer system without any treatment. Other deposited metals require pre-treatment depending on their concentrations.

A better alternative is to simply shred and regrind the metallized thermoforms. This material can then be re-extruded into roll or sheet form (as would also be done with the trimmed metallized scrap). The re-extruded material has thus been filled with metal. This material is used to form new inserts which would be deposited with metal on their exterior surfaces again. In effect the material becomes more conductive the more it is recycled. Recycling would be the recommended manner of disposing of inserts metallized with metals and alloys other than aluminum.

EXAMPLE

Eight samples were tested for shielding effectiveness using the "modified MIL-STD-285" method. In this procedure, samples to be tested are mounted in a test opening in the wall of shield room. The tests are run by radiating the test samples with a signal generator and antenna inside the room, and measuring the levels outside the shield room with a spectrum analyzer and antenna. A baseline measurement was made through the open hole, without any samples in place. The difference in these two measurements—before and after the samples are installed in the hole—yields the "shielding effectiveness."

Certain errors can be introduced in this method at lower frequencies. The "hole" itself provides shielding when the longest dimension is less than one half wavelength, but since values are subtracted from the "baseline", the errors give more conservative lower levels of shielding than free space measurements. In this case, these errors only affected the 30 and 50 MHz measurements, making those measurements more conservative by 15 dB. The remaining measurements, from 60 MHz to 3 GHz, are not affected. (NOTE: This is not considered significant, but is included for clarity.)

Tests were performed in three ranges, as follows:

Range I - 30 MHz–200 MHz. Test equipment consisted of biconical antennas, signal generator/amplifier, and spectrum analyzer. As discussed earlier, some reduction is caused by the "hole" at frequencies below 60 MHz.

Range II - 200 MHz–1 GHz. Test equipment consisted of log period antennas, signal generator, and spectrum analyzer. No reductions due to "hole" effects.

Range III - 1 GHz–3 GHz. Test equipment consisted of microwave horn antennas, microwave signal generator, and spectrum analyzer. No reductions due to "hole" effects.

Electric field measurements were made on all samples at selected frequencies from 30 MHz to 3 GHz. This data is summarized in Table 2, and FIGS. 1–5.

Surface impedance measurements were made on all samples using a Keithly micro-ohmmeter. Measurements were made approximately one inch apart at nine locations on each sample (top-middle-bottom by left-center-right). The nominal averages are summarized in Table 1. A prediction for plane wave shielding is also included, based on the following formula:

$$SE = 20 \log (Z_w / 4 Z_s)$$

SE is the shielding effectiveness in dB $Z_w$ is the wave impedance (assumed as 377 ohms)

$Z_s$ is the surface impedance (ohms/square)

This formula is a "first approximation", but the predicted data may be useful in correlating the test data.

Finally, magnetic field measurements were made on two samples at selected frequencies from 10 KHz to 20 MHz. Since low frequency magnetic field shielding normally requires thick steel or mu-metals, little shielding was anticipated.

TEST RESULTS: The test data is summarized in Table 2, and is shown graphically in FIGS. 1–5.

FIG. 1 compares the silver acrylic paint with the silver vacuum deposition coating. The silver vacuum coating performed approximately 10 dB better than the silver paint. Both samples #1 and #8 used silver paint, and show consistent test results. Sample #2 is the silver vacuum material.

FIG. 2 compares the aluminum vacuum coating, one side versus two sides with one coat of material. The double sided sample performs approximately 10 to 20 dB better. This is believed due to the second reflection that occurs at the second surface.

FIG. 3 compares the aluminum coating, one side versus two sides with two coats of material. These are quite close in performance. It was noted that the single side sample had a very low surface impedance (0.03 ohms/square) while the double sided sample had higher surface impedances (0.15 ohms/square). Had the surface impedances been the same, a larger difference would be expected. Nevertheless, one can conclude from this that two thin coats perform as well as one thick coat.

FIG. 4 compares aluminum, silver, and phosphor bronze. All three samples here were single side, single coat. Not surprisingly, the silver does the best.

For solid shields, copper would normally be expected to perform better than aluminum. In this case, however, the copper did not appear to be deposited in a uniform manner. Also, the surface impedance was much higher than the silver or aluminum.

One can conclude from this graph that while the silver does the best, the aluminum performs quite well. Unless the copper deposition problems can be overcome, aluminum is preferred.

FIG. 5 shows the brief magnetic field tests done on two samples. Although very little shielding effectiveness was expected, it appears the materials start to provide some magnetic field shielding above 1 MHz. This is consistent with other thin non-ferrous materials. (Although sometimes "magnetic shielding" is claimed based on this type of data, it is really misleading and should not be done.)

From the test data, the following conclusions were reached:

All of the samples performed quite well in the electric field testing. With the exception of the phosphor bronze sample, all other samples provided 40–60 dB of shielding. This should be more than adequate for most present commercial computer designs.

The silver vacuum sample performed better than the silver acrylic paint, providing over 60 dB of shielding. This would be very useful for high performance requirements, such as high speed computers or radio transmitters/receivers.

The double sided aluminum samples also performed quite well, providing over 50 dB of shielding. This is believed due to the double reflections provided by metallizing two surfaces. Metallizing both sides would be recommended when additional shielding is desired.

The copper (phosphor bronze) sample did not perform as well as the aluminum. This may be due to non-uniform deposition on the surface. Given the overall good performance, from the aluminum and silver, there may not be a need for a copper deposited option.

The lower the surface impedance, the better the shielding. It also appears that the surface impedance correlates quite well with predicted and measured shielding effectiveness. While not a final indicator, surface impedance (ohms/square) is a useful parameter to predict final shielding effectiveness.

Very little low frequency magnetic field shielding was provided by these samples, although some magnetic field shielding is provided above 20 MHz. This is not a surprise, since normally this requires thick steel for shielding.

Having described the invention, I claim:

1. An EMI shield comprising
   a thin-walled shape formed of thermoformable polymeric material,
   said shape having an outer surface and an inner surface and edges,
   said shape having deposited thereon a coating of conductive metal vapor,
   said coating of thickness of approximately 1 to 50 microns.
2. The EMI shield of claim 1 wherein said shape is of thickness less than 0.065 inches.
3. The EMI shield of claim 1 wherein
   said coating of conductive metal vapor is deposited on one or more of the outer surface, the inner surface and the edges of said shape.
4. The EMI shield of claim 1 wherein
   said metal coating is vacuum deposited aluminum vapor.
5. The EMI shield of claim 1 wherein
   said polymeric material is from the group consisting of polyvinyl chloride, polyethylene terephthalate, acrylonitrile-butenate-styrene, polyimide, liquid crystal polymer, polyetherimide, polysulfone, polycarbonate, polyphenylene sulfide, high-impact polystyrene, glycol-modified polyester, and polypropylene.
6. The EMI shield of claim 1 wherein
   said shape comprises a multiplicity of enclosures joined by webs.
7. The EMI shield of claim 6 wherein
   each of said enclosures has a plurality of sidewalls and an endwall,
   said enclosures may be folded about said webs into touching engagement therebetween.
8. The EMI shield of claim 7 wherein
   said enclosures are retained in engagement by conductive means.
9. The EMI shield of claim 6 wherein
   said webs have no metal coating thereon.
10. The EMI shield of claim 1 wherein
    said shape is of thickness less than 0.065 inches,
    said shape has a metal coating on one or more of the outer surface, the inner surface and the edges thereof,
    said metal coating is aluminum.
11. The EMI shield of claim 1 wherein
    said shape comprises a pair of enclosures joined by a web,
    said enclosures being generally identical,
    said web comprising a flexible hinge,
    a first of said enclosures folded about said hinge to interconnect with the other of said enclosures,
    means to retain said enclosures in electrically conductive interconnection.
12. A thin-walled polymeric body for shielding EMI comprising
    a polygonal shape formed from thin polymeric sheet which has been heated and drawn into a mold or onto a die,
    said shape having inner surfaces and outer surfaces,
    one or more of said inner surfaces and said outer surfaces having a conductive metal vapor coating thereon.
    said coasting of thickness of at least 1 micron.
13. The body of claim 12 wherein
    said polygonal shape comprises a multiplicity of sidewalls and an endwall,
    said sidewalls and said endwall are of thickness less than 0.065 inches.
14. The body of claim 12 wherein
    said polymeric sheet comprises one of the group consisting of polyvinyl chloride, polyethylene terephthalate, acrylonitrile-butenate-styrene, polyimide, liquid crystal polymer, polyetherimide, polysulfone, polycarbonate, polyphenylene sulfide, high-impact polystyrene, glycol-modified polyester, and polypropylene.
15. The body of claim 14 wherein
    said metal coating is from 1 to 50 microns in thickness,
    said sheet is from 0.006 to 0.065 inches in thickness.
16. The body of claim 12 wherein
    said shape comprises a pair of substantially similar enclosures interconnected by an integral hinge,
    each of said enclosures having sidewalls joined by an endwall, said enclosures pivotable about said hinge into touching engagement of the sidewalls thereof, mechanical means to retain said enclosures in engagement, each of said sidewalls being electrically conductive with said other of said sidewalls.

17. The body of claim 16 wherein said engaged enclosures contain an enclosed space, means for passage of selected electrical signals into the space within said engaged enclosures.

18. The body of claim 12 wherein said shape comprises a multiplicity of polygons interconnected by integral webs.

19. The body of claim 18 wherein each of said polygons has an open side, each of said webs having no conductive metal coating thereon.

20. The body of claim 12 wherein said metal vapor coating is aluminum.

* * * * *